US012604596B2

(12) United States Patent
Cho

(10) Patent No.: US 12,604,596 B2
(45) Date of Patent: Apr. 14, 2026

(54) METHOD FOR MANUFACTURING A PEROVSKITE SOLAR CELL WITH AN IMPROVED HOLE TRANSPORT LAYER AND A PEROVSKITE SOLAR CELL WITH AN IMPROVED HOLE TRANSPORT LAYER MANUFACTURED BY THE SAME METHOD

(71) Applicant: HANWHA SOLUTIONS CORPORATION, Seoul (KR)

(72) Inventor: An Na Cho, Gyeonggi-do (KR)

(73) Assignee: HANWHA SOLUTIONS CORPORATION, Seoul (KR)

( * ) Notice: Subject to any disclaimer, the term of this patent is extended or adjusted under 35 U.S.C. 154(b) by 420 days.

(21) Appl. No.: 18/011,611

(22) PCT Filed: Jun. 28, 2021

(86) PCT No.: PCT/KR2021/008061
§ 371 (c)(1),
(2) Date: Dec. 20, 2022

(87) PCT Pub. No.: WO2022/010147
PCT Pub. Date: Jan. 13, 2022

(65) Prior Publication Data
US 2023/0363183 A1    Nov. 9, 2023

(30) Foreign Application Priority Data
Jul. 8, 2020    (KR) ........................ 10-2020-0084012

(51) Int. Cl.
H10K 30/40      (2023.01)
H10K 30/50      (2023.01)
(Continued)

(52) U.S. Cl.
CPC ............. H10K 30/40 (2023.02); H10K 30/84 (2023.02); H10K 30/86 (2023.02); H10K 71/00 (2023.02); *H10K 30/50* (2023.02); *H10K 85/50* (2023.02)

(58) Field of Classification Search
CPC ........ H10K 30/40; H10K 30/84; H10K 30/86; H10K 71/00; H10K 30/50; H10K 85/50;
(Continued)

(56) References Cited

U.S. PATENT DOCUMENTS 10,340,458 B2 * 7/2019 Gong ................... H10K 85/215
10,388,898 B2 * 8/2019 Xu ........................ H01G 9/2009
(Continued)

FOREIGN PATENT DOCUMENTS

CN      102017216 A      4/2011
CN      109643761 A      4/2019
(Continued)

OTHER PUBLICATIONS

Extended European Search Report from corresponding European Patent Application No. 21838202.6, dated Nov. 6, 2023.
(Continued)

*Primary Examiner* — Caleb E Henry
(74) *Attorney, Agent, or Firm* — Harness, Dickey & Pierce, P.L.C.

(57)          ABSTRACT
The present invention relates to a method for manufacturing a perovskite solar cell and a perovskite solar cell manufactured thereby and, more specifically, to a method for manufacturing a perovskite solar cell and a perovskite solar cell manufactured thereby, wherein the method comprises the steps of: (S1) applying a) an oxidative agent, b) ultraviolet light and ozone, c) oxygen plasma, or d) nitrogen dioxide gas to a hole transport layer (HTL) of a laminate in which a substrate layer, a first electrode layer, and the hole trans-
(Continued)

100 port layer (HTL) containing a metal oxide are sequentially laminated, to oxidize the metal oxide; and (S2) sequentially laminating a perovskite layer, an electron transport layer, and a second electrode layer on the hole transport layer of the laminate.

11 Claims, 4 Drawing Sheets

(51) Int. Cl.
| | | |
|---|---|---|
| *H10K 30/84* | (2023.01) | |
| *H10K 30/86* | (2023.01) | |
| *H10K 71/00* | (2023.01) | |
| *H10K 85/50* | (2023.01) | |

(58) Field of Classification Search
CPC ...... H10K 71/30; H10K 30/81; H10K 30/821; Y02E 10/549; Y02P 70/50; Y10S 977/812
See application file for complete search history.

(56) References Cited

U.S. PATENT DOCUMENTS

| | | | | |
|---|---|---|---|---|
| 11,213,853 | B2 * | 1/2022 | Haukka | C23C 18/1225 |
| 2010/0140586 | A1 * | 6/2010 | Char | C01G 11/00 |
| | | | | 257/14 |
| 2014/0034937 | A1 | 2/2014 | Fujita et al. | |
| 2016/0005986 | A1 * | 1/2016 | Guo | H10K 30/211 |
| | | | | 438/82 |
| 2017/0025622 | A1 * | 1/2017 | Gong | H10K 30/151 |
| 2017/0200955 | A1 * | 7/2017 | Sulek | H01M 4/921 |
| 2018/0108956 | A1 * | 4/2018 | Fortenbacher | H01M 10/654 |
| 2018/0254421 | A1 * | 9/2018 | Kinge | H10K 50/115 |
| 2018/0315939 | A1 * | 11/2018 | Jung | H10F 77/12 |
| 2018/0350527 | A1 | 12/2018 | Xu | |
| 2019/0011782 | A1 * | 1/2019 | Pickett | C09K 11/883 |
| 2020/0106019 | A1 * | 4/2020 | Palmstrom | H10K 85/211 |
| 2021/0183999 | A1 * | 6/2021 | Kwon | H10H 20/818 |
| 2021/0324268 | A1 * | 10/2021 | Yang | G02B 6/005 |
| 2022/0199924 | A1 * | 6/2022 | Kobashi | G09F 9/33 |
| 2022/0199925 | A1 * | 6/2022 | Kobashi | H10K 50/115 |
| 2022/0204844 | A1 * | 6/2022 | Won | C01B 19/007 |
| 2023/0075189 | A1 * | 3/2023 | Kim | H10K 50/115 |
| 2023/0150841 | A1 * | 5/2023 | Brozell | B01D 67/00 |
| | | | | 210/500.21 |

FOREIGN PATENT DOCUMENTS

| | | |
|---|---|---|
| CN | 109841740 A | 6/2019 |
| CN | 110310888 A | 10/2019 |
| JP | H06317465 A | 11/1994 |
| JP | 2008-016868 A | 1/2008 |
| JP | 2018-506857 A | 3/2018 |
| JP | 2019-114691 A | 7/2019 |
| JP | 2019-522371 A | 8/2019 |
| KR | 10-2011-0015525 A | 2/2011 |
| KR | 10-2017-0040708 A | 4/2017 |
| WO | WO-2013/161166 A1 | 10/2013 |
| WO | WO-2017/106811 A1 | 6/2017 |

OTHER PUBLICATIONS

Kwon Uisik et al., "Solution-Processible Crystalline NiO Nanoparticles for High-Performance Planar Perovskite Photovoltaic Cells", Scientific Reports, vol. 6, No. 1, pp. 6-8, Jul. 28, 2016.

Wei Chen et al., "Molecule-Doped Nickel Oxide: Verified Charge Transfer and Planar Inverted Mixed Cation Perovskite Solar Cell", Advanced Materials VCH Publishers, DE, vol. 30, No. 20, pp. 2-7, Mar. 30, 2018.

Anonymous, "Oxidizing agent", pp. 1, Apr. 26, 2004 (Retrieved from the Internet: URL: https://en.wikipedia.org/wiki/Oxidizing_agent_ <https://protect-us.mimecast.com/s/o3WFCKrY1zU8KmmGuMRxrk?domain=en.wikipedia.org>).

Wongrerkdee Sutthipoj et al., "Simple and rapid preparation of CuO film using SILAR process for application as hole-transporting layer in p-i-n perovskite solar cell", pp. 96-97, Jun. 17, 2018.

Islam M. Bodiul et al., "Highly stable semi-transparent MAPbI3 perovskite solar cells with operational output for 4000 h", Solar Energy Materials and Solar Cells, vol. 195, pp. 324-325, Jun. 1, 2019.

Office Action from corresponding Chinese Application No. 202180046920.5, dated May 12, 2025.

International Search Report from corresponding PCT Application No. PCT/KR2021/008061, dated Sep. 17, 2021.

Wang, T., et al.; "Efficient inverted planar perovskite solar cells using ultraviolet/ozone-treated NiOx as the hole transport layer", Solar RRL, 2019, vol. 3, No. 6, article No. 1900045, pp. 1-12.

Japanese Office Action from corresponding Japanese Patent Application No. 2022-579919, dated Jan. 30, 2024.

Office Action from corresponding Japanese Patent Application No. 2022-579919, dated Nov. 12, 2024.

Office Action from corresponding Japanese Patent Application No. 2022-579919, dated Jul. 23, 2024.

Non-Final Office Action from corresponding U.S. Appl. No. 18/011,611, dated Jul. 15, 2025.

Office Action from corresponding Chinese Application No. 202180046920.5, dated Nov. 19, 2025.

* cited by examiner

METHOD FOR MANUFACTURING A PEROVSKITE SOLAR CELL WITH AN IMPROVED HOLE TRANSPORT LAYER AND A PEROVSKITE SOLAR CELL WITH AN IMPROVED HOLE TRANSPORT LAYER MANUFACTURED BY THE SAME METHOD

CROSS-REFERENCE TO RELATED APPLICATIONS

This application is a national phase application of PCT Application No. PCT/KR2021/008061, filed on Jun. 28, 2021, which claims priority to Korean Patent Application Nos. 10-2020-0084012, filed on Jul. 8, 2020. The entire disclosure of the applications identified in this paragraph is incorporated herein by reference.

TECHNICAL FIELD

The present invention relates to a method for manufacturing a perovskite solar cell and a perovskite solar cell manufactured thereby, and more particularly, to a method for manufacturing a perovskite solar cell capable of improving hole mobility of a hole transport layer while minimizing damage to other components, and a perovskite solar cell manufactured thereby.

BACKGROUND

Solar cells are core elements of solar-light power generation, which convert sunlight directly into electricity, and they are currently widely used for power supply purpose not only in homes but also in space. Recently, they have been used in the fields of aviation, meteorology, and communications, and the products such as solar-powered cars and solar-air conditioners are attracting attention.

These solar cells mainly use silicon semiconductors. Due to the price of raw materials of high-purity silicon semiconductors and the complexity of a solar cell manufacture process using the same, the unit cost of power generation is disadvantageously high. That is, it is 3 to 10 times higher than the unit cost of conventional power generation with fossil fuels, and hence the market is growing with subsidies from governments around the world. For this reason, the development and research of solar cells that do not use silicon have been actively conducted, and studies on polymer solar cells using dye-sensitized solar cells (DSSC), which use a dye that is an organic semiconductor material, and conductive polymers have been promoted since the 1990s. Despite many efforts by academics and industries, organic semiconductor-based solar cells, such as DSSC and polymer solar cells, have not yet been commercialized. However, with the advent of perovskite solar cells (PSC) that incorporate the advantages of the DSSC and the polymer solar cells, expectations for next-generation solar cells are rising.

A perovskite solar cell is a solar cell which combines a conventional DSSC and a polymer solar cell, and has improved reliability because it does not use liquid electrolyte as in DSSC. Also, the perovskite solar cell is a high efficiency solar cell due to the optical excellence of perovskite, and the efficiency is continuously improved through process improvement, material improvement, and structural improvement.

FIG. 1 is a view illustrating a perovskite solar cell. Referring to FIG. 1, a perovskite solar cell 100 includes a substrate layer 10, a first electrode layer 20, a hole transport layer 30, a perovskite layer 40, an electron transport layer 50, and a second electrode layer 60.

In the perovskite solar cell 100, mobility of electrons or holes in each layer is important, but charge extraction at the interface between each layer is also critical. If charges are not rapidly extracted at the interface, electrons and holes may recombine.

For example, $NiO_x$ contained in the hole transport layer 30 has high hole mobility in a material compared to organic hole transporters, but hole extraction is not effectively performed at the interface with the perovskite layer 40, which may adversely affect the characteristics of the solar cell 100. Ni vacancies may be adjusted using an additive or high heat in order to improve the hole extraction efficiency. However, indium tin oxide (ITO), which is mainly used for the substrate layer 10 or the first electrode layer 20 laminated on a lower surface of the hole transport layer 30, is damaged by high heat treatment, such as a significant increase in resistance at a temperature of 200° C. or higher. Therefore, a method for improving the hole extraction efficiency without damaging the substrate layer 10 or the first electrode layer 20 is needed.

DETAILED DESCRIPTION

Technical Problem

Therefore, the present invention aims to provide a method for manufacturing a perovskite solar cell capable of improving the hole mobility and hole extraction efficiency of a hole transport layer while minimizing damage to a substrate layer or an electrode layer, and a perovskite solar cell produced thereby.

Technical Solution

To achieve the above object, a method for manufacturing a perovskite solar cell according to one aspect of the present invention includes the steps of: (S1) applying a) an oxidative agent, b) ultraviolet light and ozone, c) oxygen plasma, or d) nitrogen dioxide gas to a hole transport layer (HTL) of a laminate in which a substrate layer, a first electrode layer, and the hole transport layer (HTL) containing a metal oxide are sequentially laminated, to oxidize the metal oxide; and (S2) sequentially laminating a perovskite layer, an electron transport layer, and a second electrode layer on the hole transport layer of the laminate.

Here, the step S1 may further include treating the hole transport layer with a solution containing the oxidative agent to oxidize the metal oxide, and then removing a solvent included in the solution.

The metal oxide in the step S1 may be $NiO_x$.

At this time, in the step S1, the $NiO_x$ may be oxidized to improve Ni vacancies in the hole transport layer.

In the step S1, the $NiO_x$ may be oxidized to oxidize a part of $Ni^{2+}$ included in the hole transport layer to $Ni^{3+}$.

In this case, a ratio between the content of $Ni^{3+}$ and the total content of $Ni^{2+}$ and $Ni^{3+}$ may be 0.6 or less.

Meanwhile, the first electrode layer and the second electrode layer may include, independently of each other, at least one selected from the group consisting of indium tin oxide (ITO), indium cerium oxide (ICO), indium tungsten oxide (IWO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), and ZnO.

In addition, the electron transport layer may include at least one selected from the group consisting of Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, and SrTi oxide.

A perovskite solar cell according to another aspect of the present invention is formed by sequentially laminating a substrate layer, a first electrode layer, a hole transport layer (HTL) including a metal oxide, a perovskite layer, an electron transport layer, and a second electrode layer, wherein the metal oxide is $NiO_x$ and the hole transport layer includes $Ni^{2+}$ and $Ni^{3+}$.

Advantageous Effects

According to the present invention, a metal oxide included in a hole transport layer is oxidized by applying a) an oxidative agent, b) ultraviolet light and ozone, c) oxygen plasma, or d) nitrogen dioxide gas to the hole transport layer without heat treatment at a high temperature of 200° C. or higher, so that the hole mobility or hole extraction efficiency of the hole transport layer may be improved without damaging the substrate layer or the first electrode layer.

As such, when the hole extraction efficiency of the hole transport layer is improved, recombination due to inefficient hole extraction at the interface with the perovskite layer is prevented, ultimately improving the photoelectric conversion efficiency.

BRIEF DESCRIPTION OF DRAWINGS

The accompanying drawings illustrate preferred embodiments of the present invention and, together with the foregoing disclosure, serve to provide further understanding of the technical features of the present invention. However, the present invention is not to be construed as being limited to the drawings.

FIG. 3 is a conceptual diagram illustrating Ni vacancies in a hole transport layer that are improved through treatment with an oxidative agent, according to an embodiment of the present invention.

MODE FOR INVENTION

Hereinafter, the present invention will be described with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, and not intended to limit the scope of the invention, so it should be understood that other equivalents and modifications could be made thereto without departing from the spirit and scope of the invention.

Figure 1:
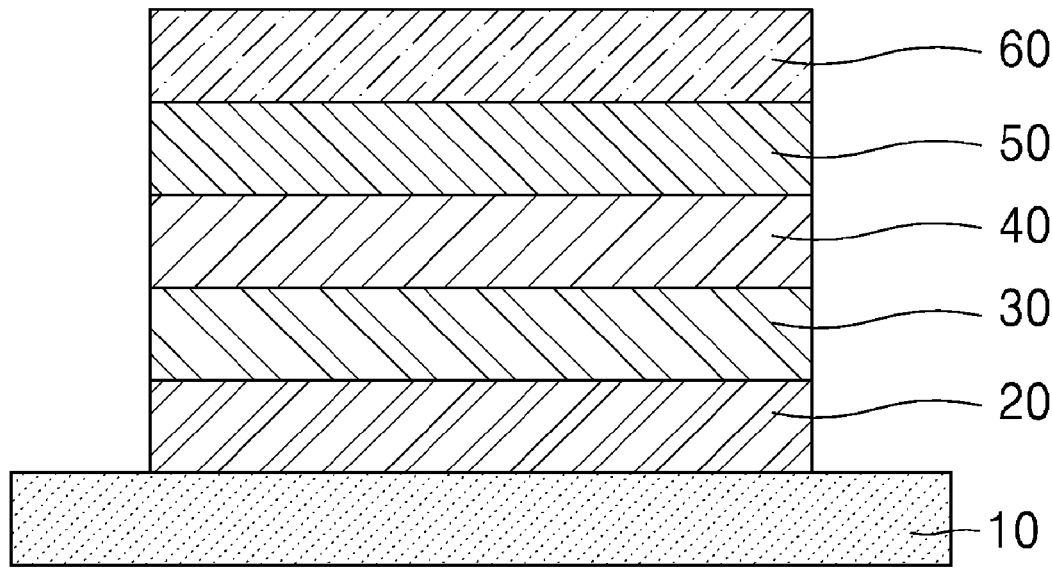
FIG. 1 is a side view illustrating a perovskite solar cell.
Figure 2:
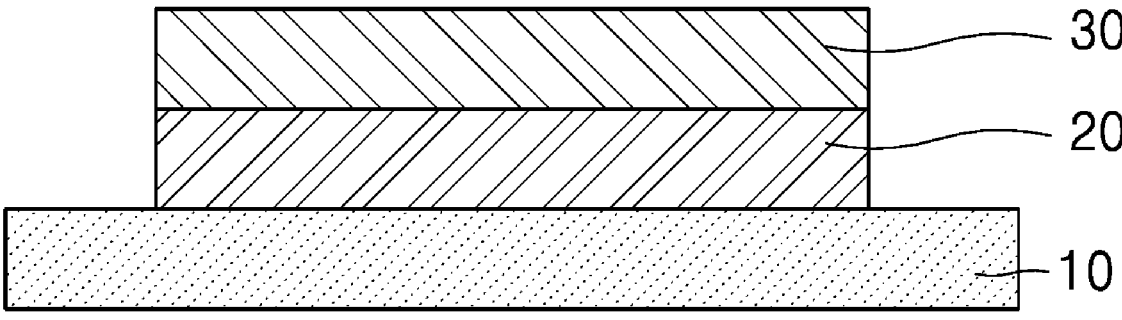
FIG. 2 is a side view illustrating a laminate in which a substrate layer, a first electrode layer, and a hole transport layer are laminated, according to the present invention.

FIG. 2 is a view illustrating a laminate in which a substrate layer, a first electrode layer, a hole transport layer, according to the present invention. A method for manufacturing a perovskite solar cell according to the present invention is described below with reference to FIG. 2.

First, a hole transport layer (HTL) 30 of a laminate in which a substrate layer 10, a first electrode layer 20, and the hole transport layer 30 including metal oxide are sequentially laminated is treated with a) an oxidative agent, b) ultraviolet light and ozone, c) oxygen plasma, or d) nitrogen dioxide gas to oxidize the metal oxide (step S1).

As such, by oxidizing the metal oxide included in the hole transport layer 30 through the above methods, such as treating the hole transport layer 30 with an oxidative agent, without applying heat treatment at a high temperature of 200° C. or higher, the hole mobility or hole extraction efficiency of the hole transport layer 30 may be improved without damaging the substrate layer 10 or the first electrode layer 20.

At this time, as the oxidative agent, any material that oxidizes metal oxide to improve metal vacancies in the hole transport layer or increases the oxidation number of metal ions can be used, but specifically, $H_2O_2$, $HNO_3$, $H_2SO_4$, $KNO_3$ and the like may be used.

Here, step S1 may include treating the hole transport layer 30 with a solution containing the oxidative agent to oxidize the metal oxide, and then removing a solvent included in the solution.

At this time, a solution process, such as spin-coating the solution containing the oxidative agent on an upper surface of the hole transport layer 30, or dipping coating in which the laminate is dipped into the solution, is performed, then the metal oxide is oxidized, and then the solvent is removed by evaporation.

The solvent may be a volatile solvent in order to facilitate subsequent evaporation, and more specifically, an alcohol including deionized water, ethyl ether, acetone, ethanol, methanol, isopropyl alcohol, and the like, but is not limited thereto. During evaporation of the solvent, heat may be applied at a temperature of 150° C. or less to prevent damage to perovskite.

In addition, the ultraviolet and ozone treatment according to the present invention may be performed for at least 5 minutes to oxide the metal oxide.

Also, the oxygen plasma treatment of the present invention may be a low-temperature oxygen plasma treatment maintained at a temperature of less than 200° C.

Moreover, the nitrogen dioxide gas treatment of the present invention may be performed to oxidize the metal oxide by flowing dry air containing nitrogen dioxide onto the upper surface of the hole transport layer 30. At this time, the concentration of nitrogen dioxide in the dry air may be 5 to 1,000 ppm, and the temperature may be maintained at 25 to 35° C.

Through the step of oxidizing the metal oxide, only the surface of the hole transport layer 30 may be oxidized or the entire hole transport layer 30 may be oxidized.

The substrate layer 10 may include a transparent material that transmits light. In addition, the substrate layer 10 may include a material that selectively transmits light of a desired wavelength. The substrate layer 10 may include, for example, transparent conductive oxide (TCO) such as silicon oxide, aluminum oxide, indium tin oxide (ITO), and fluorine tin oxide (FTO), glass, quartz, or a polymer. For example, the polymer may include at least one of polyimide, polyethylenenaphthalate (PEN), polyethyleneterephthalate (PET), polymethylmethacrylate (PMMA), or polydimethylsiloxane (PDMS).

The substrate layer 10 may have a thickness ranging from, for example, 100 μm to 150 μm, and may have, for example, 125 μm. However, the material and thickness of the substrate layer 10 are not limited to the examples described above, and may be suitably selected according to the technical idea of the present invention.

The first electrode layer 20 may be formed of a light-transmitting conductive material. The light-transmitting conductive material may include, for example, transparent conductive oxides, carbonaceous conductive materials, metallic materials, and the like. The transparent conductive oxides may include, for example, indium tin oxide (ITO), indium cerium oxide (ICO), indium tungsten oxide (IWO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), ZnO, and the like. As the carbonaceous conductive material, for example, graphene or carbon nanotubes may be used, and as the metallic material, for example, metal (Ag) nanowires or multi-layered metal thin films such as Au/Ag/Cu/Mg/Mo/Ti may be used. As used herein, the term "transparent" refers to the ability to transmit light to a certain extent, and is not necessarily interpreted as meaning complete transparency. The materials listed above are not limited to the embodiments described above and may be made of various materials, and various modifications of the structure thereof may be possible, such as a single layer structure or a multi-layered structure.

At this time, the first electrode layer 20 may be formed by being laminated on the substrate layer 10 or may be integrally formed with the substrate layer 10.

Also, the hole transport layer 30 may be laminated on the first electrode layer 20, which serves to transfer holes generated in a perovskite layer 40 to the first electrode layer 20. The hole transport layer 30 may include at least one of metal oxides selected from tungsten oxide ($WO_x$), molybdenum oxide ($MoO_x$), vanadium oxide ($V_2O_5$), nickel oxide ($NiO_x$), and mixtures thereof. In addition, the hole transport layer 30 may include at least one selected from the group consisting of unimolecular hole transport materials and polymer hole transport materials, but is not limited thereto, and materials used in the art may be used without limitation. For example, spiro-MeOTAD [2,2',7,7'-tetrakis(N,Np-dimethoxy-phenylamino)-9,9'-spirobifluorene] may be used as the unimolecular hole transport material, and P3HT [poly (3-hexylthiophene)], PTAA (polytriarylamine), poly(3,4-ethylenedioxythiophene), or polystyrene sulfonate (PEDOT:PSS) may be used as the polymer hole transport material, but the present invention is not limited thereto.

In addition, the hole transport layer 30 may further include a doping material, and the doping material may include a dopant selected from the group consisting of a Li-based dopant, a Co-based dopant, a Cu-based dopant, a Cs-based dopant, and combinations thereof, but is not limited thereto.

The hole transport layer 30 may be formed by applying a precursor solution for a hole transport layer on the first electrode layer and drying the precursor solution, and before applying the precursor solution, the first electrode layer may be subjected to UV-ozone treatment to lower the work function of the first electrode layer 20, remove surface impurities, and perform hydrophilic treatment. The precursor solution may be applied using a method such as spin coating, but is not limited thereto. The thickness of the hole transport layer 30 formed may be 10 to 500 nm.

At this time, the metal oxide of the hole transport layer 30 is preferably $NiO_x$, which has advantageously high hole mobility in the material compared to other organic hole transporters or other metal oxides.

Figure 3:
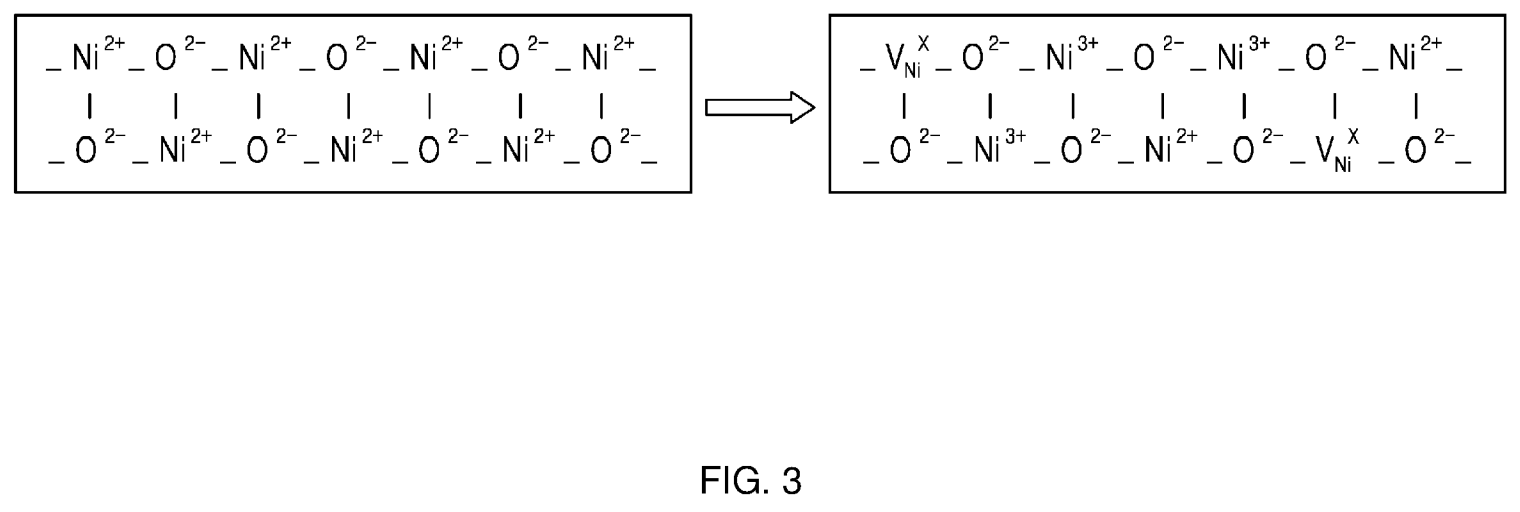

FIG. 3 is a conceptual diagram illustrating Ni vacancies in the hole transport layer 30 that are improved through treatment with an oxidative agent, according to an embodiment of the present invention. Referring to FIG. 3, the $NiO_x$ may be oxidized to improve Ni vacancies in the hole transport layer in step S1. In addition, the $NiO_x$ may be oxidized to oxidize a part of $Ni^{2+}$ included in the hole transport layer to $Ni^{3+}$. As such, when the Ni vacancies are increased or a part of $Ni^{2+}$ is oxidized to $Ni^{3+}$, the hole mobility is increased and resistance is reduced, thereby improving the hole extraction efficiency of the hole transport layer 30.

Here, the ratio between the content of $Ni^{3+}$ and the total content of $Ni^{2+}$ and $Ni^{3+}$ is 0.6 or less, specifically, 0.3 or less. At this time, if the ratio of the contents exceeds 0.6, that is, if the content of $Ni^{3+}$ is excessively high, optical transmittance may be reduced. In addition, as the proportion of $Ni^{3+}$ increases, a valence band maximum (VBM) of the hole transport layer 30 shifts downward. When the ratio of the content of $Ni^{3+}$ and the total content of $Ni^{2+}$ and $Ni^{3+}$ is approximately 0.6, more preferably, approximately 0.3, energy matching with the perovskite layer occurs well, resulting in effective charge extraction. If the content of $Ni^{3+}$ is excessively high and thus the VBM (work function) excessively drops, mismatch in energy level alignment occurs at the interference with the perovskite, leading to a problem of interfering hole extraction at the interface.

Figure 4:
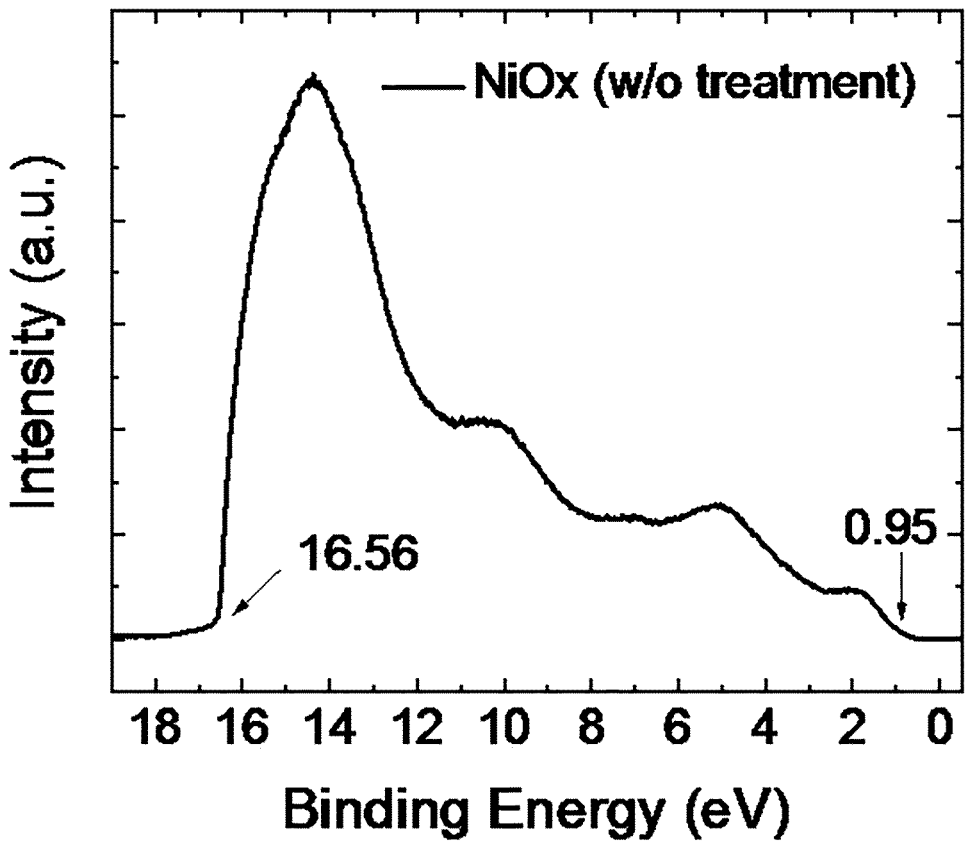
FIG. 4 is a graph showing UPS analysis results when a hole transport layer containing $NiO_x$ is not oxidized.
Figure 5:
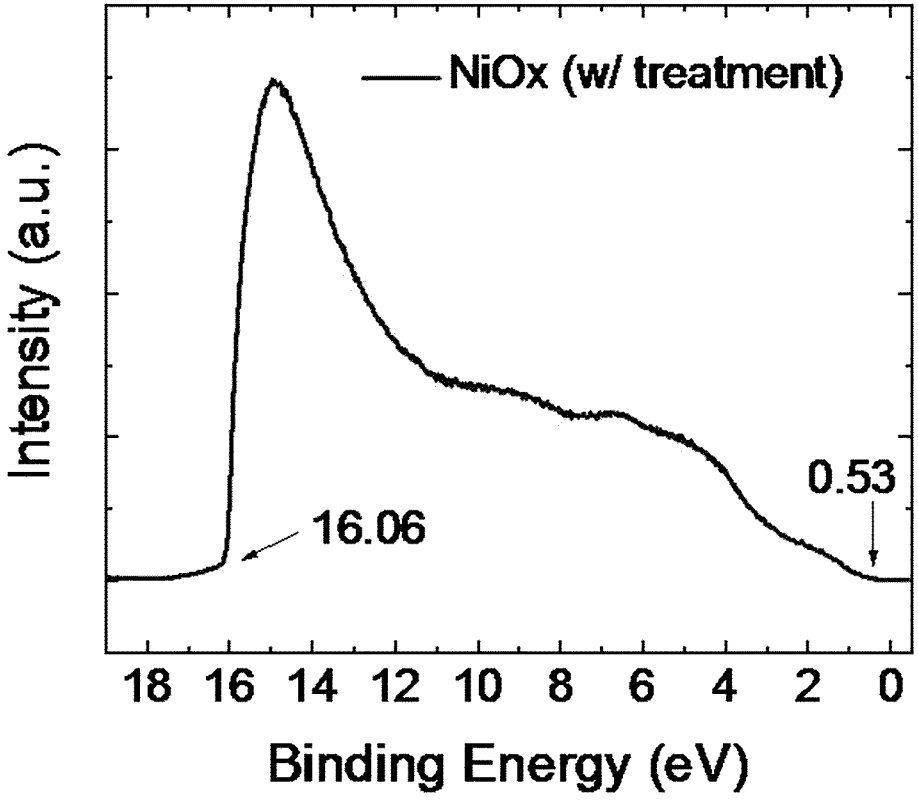
FIG. 5 is a graph showing UPS analysis results when a hole transport layer containing $NiO_x$ is oxidized.

FIG. 4 is a graph showing UPS analysis results when a hole transport layer containing $NiO_x$ is not oxidized, FIG. 5 is a graph showing UPS analysis results when a hole transport layer containing $NiO_x$ is oxidized, and Table 1 below shows work function and valence band edge values for each of the cases.

TABLE 1

|  | $NiO_x$ (w/o treatment) | $NiO_x$ (w/ treatment) |
|---|---|---|
| Work function | 4.66 | 5.16 |
| Valence band edge | 5.61 | 5.69 |

It can be seen that, as the proportion of $Ni^{3+}$ increases after oxidization of $NiO_x$, the value of the work function increases and approaches the value of the Valence band edge, which means that there is an effect similar to p-type doping. 1) in the case of $NiO_x$ (w/o treatment)

Work function: 21.22 eV (He I UPS spectra)–16.56 eV=4.66 eV

Valence band edge: 4.66 (Work function) eV+0.95 eV=5.61 eV

2) In the case of $NiO_x$ (w/treatment)

Work function: 21.22 eV (He I UPS spectra)–16.56 eV=5.16 eV

Valence band edge: 5.16 (Work function) eV+0.53 eV=5.69 eV

Subsequently, the perovskite layer 40, an electron transport layer 50, and a second electrode layer 60 are sequentially laminated on the hole transport layer 30 of the laminate (step S2).

In the perovskite solar cell 100 according to the present invention, a perovskite compound is used as a photoactive material that absorbs sunlight to generate photoelectron-optical hole pairs. Perovskite advantageously has a direct band gap, an optical absorption coefficient as high as $1.5 \times 10^4 \, cm^{-1}$ at 550 nm, excellent charge transfer characteristics, and superior resistance to defects.

In addition, the perovskite compound has advantages in that the light absorber may be formed by a simple, easy, and low-cost process of applying and drying a solution, a light absorber composed of coarse grains may be formed due to spontaneous crystallization caused by drying of the applied solution, and conductivity for both of the electron and hole is excellent.

This perovskite compound may be represented by the structure of Formula 1 below.

$$ABX_3 \qquad \text{[Formula 1]}$$

(Here, A is a monovalent organic ammonium cation or metal cation, B is a divalent metal cation, and X is a halogen anion)

The perovskite compound may include, for example, $CH_3NH_3PbI_3$, $CH_3NH_3PbI_xCl_{3-x}$, $MAPbI_3$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, $(CH_3NH_3)(HC(NH_2)_2)_{1-y}PbCl_xBr_{3-x}$, and the like ($0 \le x$, $y \le 1$). In addition, a compound in which A of $ABX_3$ is partially doped with Cs may also be used.

The electron transport layer 50 may be located on the perovskite layer 40, may serve to facilitate transfer of electrons generated in the perovskite layer 40 to the second electrode layer 60. The electron transport layer 50 may include metal oxides. For example, Ti oxides, Zn oxides, In oxides, Sn oxides, W oxides, Nb oxides, Mo oxides, Mg oxides, Zr oxides, Sr oxides, Yr oxides, La oxides, V oxides, Al oxides, Y oxides, Sc oxides, Sm oxides, Ga oxides, SrTi oxides, and the like may be used. The electron transport layer 50 according to the present invention may include a compact structure of $TiO_2$, $SnO_2$, $WO_3$, or $TiSrO_3$. The electron transport layer 50 may further include an n-type or p-type dopant as needed.

In addition to the above-described interlayer structures and/or materials of the hole transport layer 30, the perovskite layer 40, and/or the electron transport layer 50, various layer structures and materials constituting the perovskite solar cell 100 may be applied, and the hole transport layer 30 and the electron transport layer 50 may be formed by swapping their positions.

In addition, the second electrode layer 60 may be formed of a light-transmitting conductive material. The light-transmitting conductive material may include, for example, transparent conductive oxides, carbonaceous conductive materials, metallic materials, and the like. The transparent conductive oxides may include, for example, indium tin oxide (ITO), indium cerium oxide (ICO), indium tungsten oxide (IWO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), ZnO, and the like. As the carbonaceous conductive material, for example, graphene or carbon nanotubes may be used, and as the metallic material, for example, metal (Ag) nanowires or multi-layered metal thin films such as Au/Ag/Cu/Mg/Mo/Ti may be used. As used herein, the term "transparent" refers to the ability to transmit light to a certain extent, and is not necessarily interpreted as meaning complete transparency. The materials listed above are not limited to the embodiments described above and may be made of various materials, and various modifications of the structure thereof may be possible, such as a single layer structure or a multi-layered structure.

Although not illustrated, a bus electrode (not shown) may be further disposed on the second electrode layer 60 to lower the resistance of the second electrode layer 60 and further facilitate transfer of charges. The bus electrode may be made of Ag, Mg, Al, Pt, Pd, Au, Ni, Nd, Ir, Cr and/or a compound thereof.

Meanwhile, the embodiments of the disclosure disclosed in the specification and drawings have suggested given examples in order to easily describe the technical contents of the invention and to help understanding of the disclosure, and are not intended to limit the scope of the disclosure. That is, it is evident to those skilled in the art to which the disclosure pertains that other modified examples based on technical spirit of the invention may be practiced.

What is claimed is:

1. A method for manufacturing a perovskite solar cell comprising the steps of:
   (S1) applying a) an oxidative agent, b) oxygen plasma, or c) nitrogen dioxide gas to a hole transport layer (HTL) of a laminate in which a substrate layer, a first electrode layer, and the hole transport layer (HTL) containing a metal oxide are sequentially laminated, to oxidize the metal oxide without heat treatment at a high temperature of 200° C. or higher; and
   (S2) sequentially laminating a perovskite layer, an electron transport layer, and a second electrode layer on the hole transport layer of the laminate.

2. The method of claim 1, wherein the step S1 further comprises treating the hole transport layer with a solution containing the oxidative agent to oxidize the metal oxide, and then removing a solvent included in the solution.

3. The method of claim 1, wherein the metal oxide in the step S1 may be $NiO_x$.

4. The method of claim 3, wherein, in the step S1, the $NiO_x$ is oxidized to improve Ni vacancies in the hole transport layer.

5. The method of claim 3, wherein, in the step S1, the $NiO_x$ is oxidized to oxidize a part of $Ni^{2+}$ included in the hole transport layer to $Ni^{3+}$.

6. The method of claim 5, wherein a ratio between the content of $Ni^{3+}$ and the total content of $Ni^{2+}$ and $Ni^{3+}$ is 0.6 or less.

7. The method of claim 1, wherein the first electrode layer and the second electrode layer comprise, independently of each other, at least one selected from the group consisting of indium tin oxide (ITO), indium cerium oxide (ICO), indium tungsten oxide (IWO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), and ZnO.

8. The method of claim 1, wherein the electron transport layer comprises at least one selected from the group consisting of Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, and SrTi oxide.

9. A method for manufacturing a perovskite solar cell comprising the steps of:
   (S1) applying a) an oxidative agent, b) ultraviolet light and ozone, c) oxygen plasma, or d) nitrogen dioxide gas to a hole transport layer (HTL) of a laminate in which a substrate layer, a first electrode layer, and the hole transport layer (HTL) containing a metal oxide are sequentially laminated, to oxidize the metal oxide; and (S2) sequentially laminating a perovskite layer, an electron transport layer, and a second electrode layer on the hole transport layer of the laminate, wherein the step S1 further comprises treating the hole transport layer with a solution containing the oxidative agent to oxidize the metal oxide, and then removing a solvent included in the solution.

10. A method for manufacturing a perovskite solar cell comprising the steps of:

(S1) applying a) an oxidative agent, b) ultraviolet light and ozone, c) oxygen plasma, or d) nitrogen dioxide gas to a hole transport layer (HTL) of a laminate in which a substrate layer, a first electrode layer, and the hole transport layer (HTL) containing a metal oxide are sequentially laminated, to oxidize the metal oxide; and (S2) sequentially laminating a perovskite layer, an electron transport layer, and a second electrode layer on the hole transport layer of the laminate, wherein the metal oxide in the step S1 may be NiOx, wherein, in the step S1, the NiOx is oxidized to oxidize a part of $Ni^{2+}$ included in the hole transport layer to $Ni^{3+}$.

11. The method of claim 10, wherein a ratio between the content of $Ni^{3+}$ and the total content of $Ni^{2+}$ and $Ni^{3+}$ is 0.6 or less.

\* \* \* \* \*